United States Patent
Chilakapati et al.

(10) Patent No.: US 8,958,575 B2
(45) Date of Patent: Feb. 17, 2015

(54) AMPLIFIER WITH CONFIGURABLE DC-COUPLED OR AC-COUPLED OUTPUT

(75) Inventors: Uma Chilakapati, San Diego, CA (US); Anurag Pulincherry, Karnataka (IN); Seyfollah Bazarjani, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1564 days.

(21) Appl. No.: 12/034,479

(22) Filed: Feb. 20, 2008

(65) Prior Publication Data

US 2009/0002075 A1    Jan. 1, 2009

Related U.S. Application Data

(60) Provisional application No. 60/947,313, filed on Jun. 29, 2007.

(51) Int. Cl.
*H03F 99/00*    (2009.01)
*H04R 3/00*    (2006.01)
(Continued)

(52) U.S. Cl.
CPC ............ *H03F 3/20* (2013.01); *H03F 3/3022* (2013.01); *H03F 3/45192* (2013.01); *H03F 3/45475* (2013.01); *H03F 3/68* (2013.01); *H03F 2200/03* (2013.01); *H03F 2203/45101* (2013.01)
USPC .......................................... 381/120; 381/111

(58) Field of Classification Search
USPC ........................................................ 381/120
See application file for complete search history.

(56) References Cited

U.S. PATENT DOCUMENTS 3,370,242 A  * 2/1968 Offner ............................ 330/9
3,944,941 A    3/1976 Tsuda
(Continued)

FOREIGN PATENT DOCUMENTS

JP    59012610    1/1984
JP    4176204 A    6/1992
JP    7046055 A    2/1995

OTHER PUBLICATIONS

International Search Report and Written Opinion—PCT/US08/068066, International Search Authority—European Patent Office, Sep. 9, 2008.
(Continued)

*Primary Examiner* — Matthew Landau
*Assistant Examiner* — Igwe U Anya
(74) *Attorney, Agent, or Firm* — Ramin Mobarhan

(57) ABSTRACT

A multi-mode amplifier with configurable DC-coupled or AC-coupled output is described. In one design, the multi-mode amplifier includes an amplifier and at least one DC level shifting circuit. The amplifier receives and amplifies an input signal and provides an output signal that is suitable for DC coupling to a load in a DC-coupled mode and for AC coupling to the load in an AC-coupled mode. The at least one DC level shifting circuit performs DC level shifting for at least one (e.g., input and/or output) common-mode voltage of the amplifier and is controlled based on whether the amplifier is operating in the DC-coupled or AC-coupled mode. The amplifier operates between $V_{DD}$ and $V_{NEG}$ supplies in the DC-coupled mode and between $V_{DD}$ and $V_{SS}$ supplies in the AC-coupled mode. The amplifier may include at least one gain stage, an internal DC level shifting circuit, and an output stage.

32 Claims, 11 Drawing Sheets

(51) Int. Cl.
  *H03F 3/20* (2006.01)
  *H03F 3/30* (2006.01)
  *H03F 3/45* (2006.01)
  *H03F 3/68* (2006.01)

(56) References Cited

U.S. PATENT DOCUMENTS

| | | | | |
|---|---|---|---|---|
| 4,025,869 | A * | 5/1977 | Smith | 327/307 |
| 4,308,504 | A * | 12/1981 | Ida | 330/253 |
| 4,517,523 | A * | 5/1985 | Miles | 330/126 |
| 4,536,666 | A * | 8/1985 | Metz et al. | 327/594 |
| 4,743,844 | A * | 5/1988 | Odenheimer et al. | 324/121 R |
| 4,833,418 | A * | 5/1989 | Quintus et al. | 330/9 |
| 4,990,803 | A * | 2/1991 | Gilbert | 327/351 |
| 5,307,025 | A * | 4/1994 | Colvin et al. | 330/267 |
| 5,392,004 | A * | 2/1995 | Masliah | 330/296 |
| 5,424,683 | A * | 6/1995 | Takahashi | 330/255 |
| 5,642,074 | A | 6/1997 | Ghaffaripour et al. | |
| 6,107,882 | A * | 8/2000 | Gabara et al. | 330/253 |
| 6,304,138 | B1 | 10/2001 | Johnson | |
| 6,388,477 | B1 | 5/2002 | Juang | |
| 6,577,187 | B1 * | 6/2003 | Lesko | 330/11 |
| 6,577,197 | B1 | 6/2003 | Morrish | |
| 6,600,365 | B1 * | 7/2003 | Frith | 330/51 |
| 6,836,185 | B1 * | 12/2004 | Pobanz | 330/260 |
| 6,898,092 | B2 * | 5/2005 | Briere et al. | 363/39 |
| 6,914,485 | B1 * | 7/2005 | Carroll | 330/258 |
| 7,043,033 | B1 * | 5/2006 | Toosky | 381/120 |
| 7,233,274 | B1 * | 6/2007 | Kuhn | 341/161 |
| 7,358,742 | B2 * | 4/2008 | Cehelnik | 324/457 |
| 7,511,554 | B2 * | 3/2009 | Kaneko et al. | 327/333 |
| 7,532,873 | B2 * | 5/2009 | Mohindra | 455/234.1 |
| 7,545,219 | B1 * | 6/2009 | Voo | 330/296 |
| 7,573,299 | B2 * | 8/2009 | Watarai | 326/83 |
| 7,899,196 | B2 * | 3/2011 | Furst et al. | 381/111 |
| 8,254,598 | B2 * | 8/2012 | Holzmann | 381/111 |
| 2005/0147229 | A1 * | 7/2005 | King | 379/388.01 |
| 2005/0186927 | A1 * | 8/2005 | Hayashi et al. | 455/232.1 |
| 2005/0242885 | A1 * | 11/2005 | Craynon et al. | 330/297 |
| 2007/0110252 | A1 * | 5/2007 | Garcia et al. | 381/58 |
| 2007/0279124 | A1 * | 12/2007 | Watarai | 327/560 |
| 2008/0024213 | A1 * | 1/2008 | Magrath | 330/96 |
| 2008/0309395 | A1 * | 12/2008 | Kaneko et al. | 327/333 |
| 2009/0316935 | A1 * | 12/2009 | Furst et al. | 381/111 |

OTHER PUBLICATIONS

Chilakapati U, et al., "A CMOS Transconductor With 80-db SFDR up to 10 MHz," IEEE JSSC, vol. 37, No. 3, Mar. 2002.
Taiwan Search Report—TW097124395—TIPO—Jun. 10, 2011.

* cited by examiner

US 8,958,575 B2

AMPLIFIER WITH CONFIGURABLE DC-COUPLED OR AC-COUPLED OUTPUT

CLAIM OF PRIORITY UNDER 35 U.S.C. §119

The present Application for Patent claims priority to Provisional Application Ser. No. 60/947,313, entitled "PROGRAMMABLE LEGACY AND GROUND-REFERENCED CAPLESS HEADPHONE POWER AMPLIFIER," filed Jun. 29, 2007, assigned to the assignee hereof, and expressly incorporated herein by reference.

BACKGROUND

I. Field

The present disclosure relates generally to electronics, and more specifically to an amplifier.

II. Background

Amplifiers are commonly used to amplify and/or buffer signals to obtain the desired signal level and/or signal drive. Amplifiers are widely used for various applications such as communication, computing, networking, consumer electronics, etc. For example, in a wireless communication device such as a cellular phone, amplifiers may be used to drive headphones, earpieces, etc. It may be desirable for these amplifiers to provide the desired signal drive and/or have low power consumption.

SUMMARY

A multi-mode amplifier with configurable DC-coupled or AC-coupled output is described herein. DC stands for direct current, and AC stands for alternating current. DC coupling refers to coupling of an output signal directly to a load. AC coupling refers to coupling of an output signal to a load via a capacitor, which acts as a DC block. The multi-mode amplifier may be used as a headphone amplifier and/or for other output amplifiers.

In one design, the multi-mode amplifier includes an amplifier and at least one DC level shifting circuit. The amplifier receives and amplifies an input signal and provides an output signal that is suitable for DC coupling to a load in a DC-coupled mode and for AC coupling to the load in an AC-coupled mode. The at least one DC level shifting circuit performs DC level shifting as needed for at least one (e.g., input and/or output) common-mode voltage of the amplifier. The at least one DC level shifting circuit is controlled based on whether the amplifier is operating in the DC-coupled mode or the AC-coupled mode.

The amplifier may operate between an upper power supply $V_{DD}$ and a first lower power supply $V_{NEG}$ in the DC-coupled mode and between the upper power supply and a second lower power supply $V_{SS}$ in the AC-coupled mode. The amplifier may include at least one gain stage to provide amplification, an internal DC level shifting circuit, and an output stage. The internal DC level shifting circuit may provide a first internal common-mode voltage in the DC-coupled mode and a second internal common-mode voltage in the AC-coupled mode. The output stage may include (i) a first output drive section to provide signal drive in both the DC-coupled and AC-coupled modes and (ii) a second output drive section to provide additional signal drive in the AC-coupled mode.

Various aspects and features of the disclosure are described in further detail below.

DETAILED DESCRIPTION

The multi-mode amplifier with configurable DC-coupled or AC-coupled output described herein may be used for various applications such as audio, video, input/output (I/O) interface, etc. For clarity, the use of the multi-mode amplifier for audio is described below.

Figure 1:
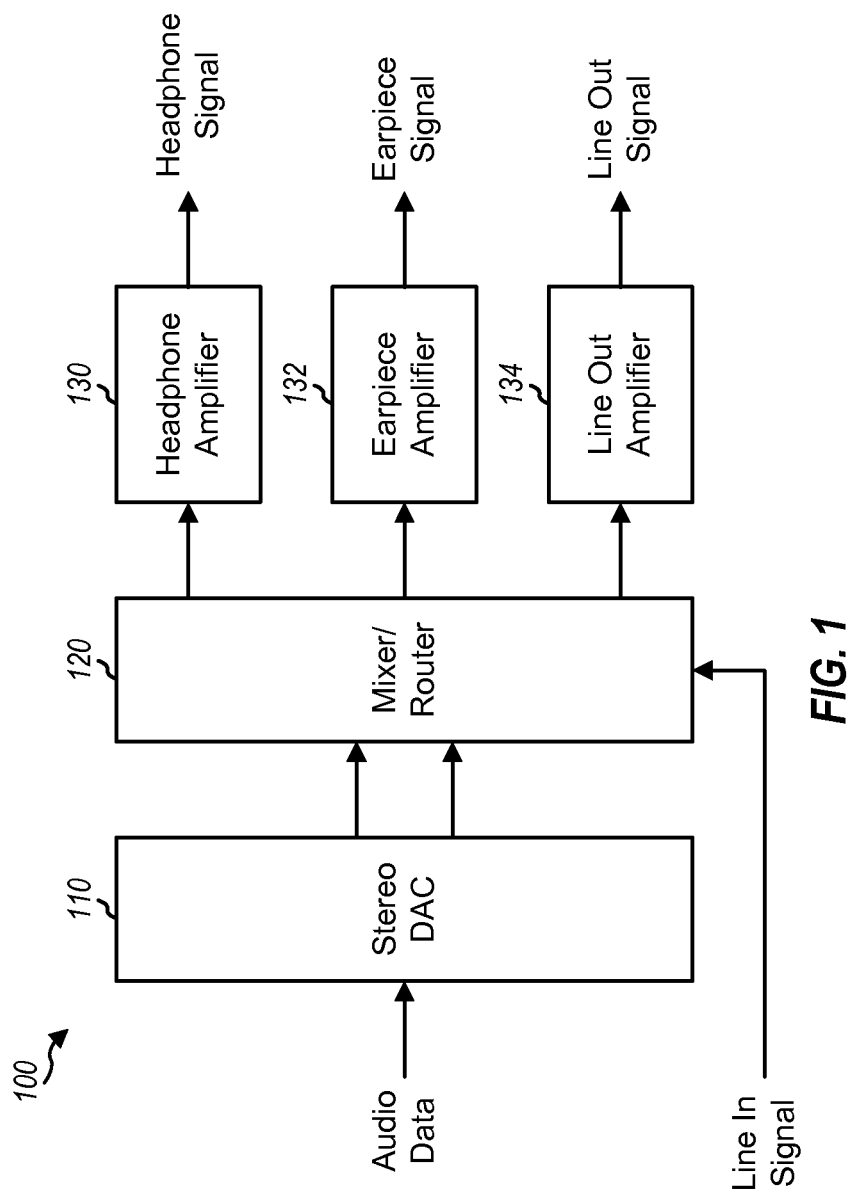
FIG. 1 shows a block diagram of an audio circuit.

FIG. 1 shows a block diagram of an audio circuit 100, which may be used for a cellular phone and other electronics devices. Within audio circuit 100, a stereo digital-to-analog converter (DAC) 110 may receive audio data, convert the data from digital to analog, and provide analog signals for left, right, and mono. A mixer/router 120 may receive the analog signals from DAC 110 and a line in signal, combine and/or route the signals as appropriate, and provide input signals to a headphone amplifier 130, an earpiece amplifier 132, and a line out amplifier 134. Each output amplifier 130 to 134 may amplify and/or buffer its input signal and provide a corresponding output signal. In general, any number of output amplifiers may be used to provide any number of output signals for any type of output devices.

The multi-mode amplifier with configurable DC-coupled or AC-coupled output may be used for headphone amplifier 130 and/or other output amplifiers. Either DC-coupled output or AC-coupled output may be selected by controlling support circuitry for the multi-mode amplifier, as described below.

Figure 2A:
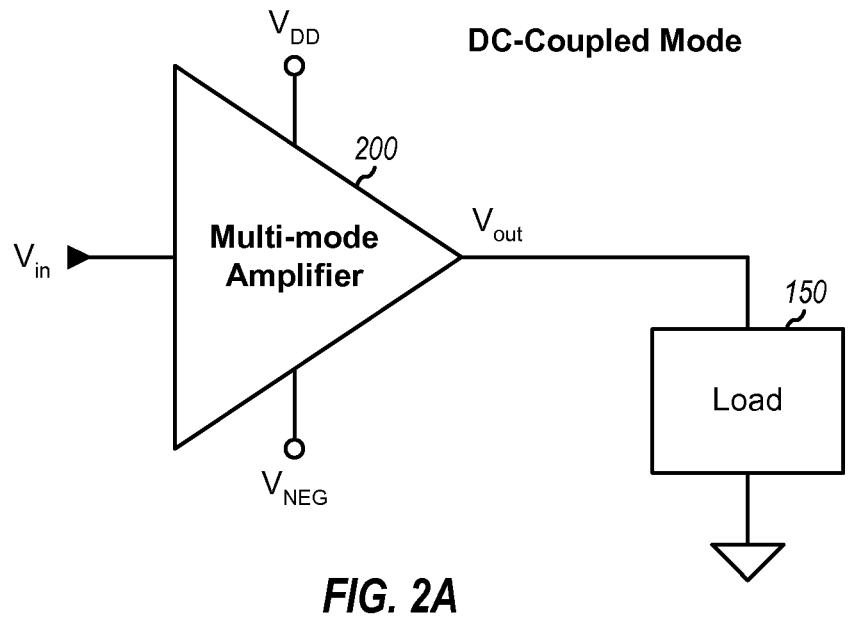
FIG. 2A shows operation of a multi-mode amplifier in the DC-coupled mode.

FIG. 2A shows operation of a multi-mode amplifier 200 in a DC-coupled mode, which may also be referred to as a capless mode, a ground-reference mode, a ground-reference capless mode, etc. In the DC-coupled mode, multi-mode amplifier 200 may operate between an upper power supply $V_{DD}$ and a lower power supply $V_{NEG}$ and may directly drive an output load 150. The DC-coupled mode may be used to eliminate an AC coupling capacitor at the amplifier output and to reduce component count and bill of material (BOM).

Figure 2B:
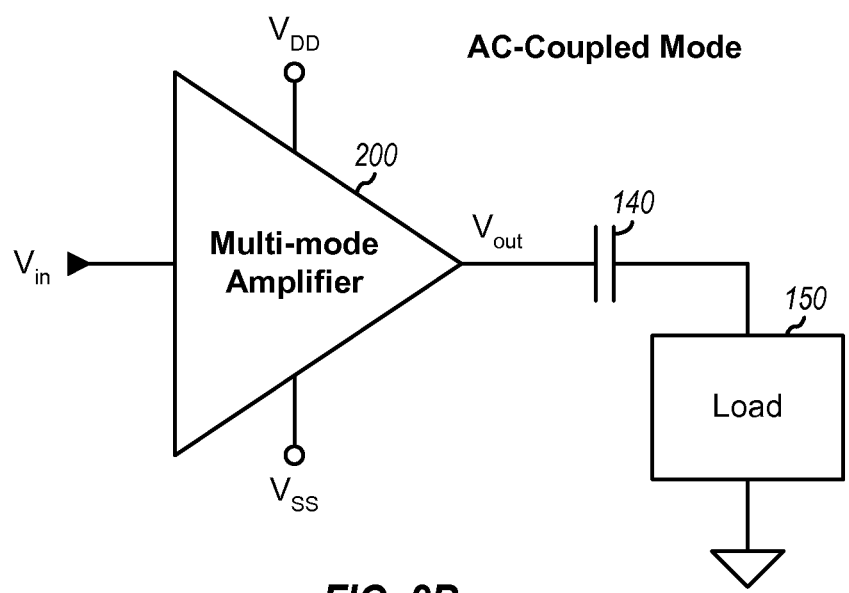
FIG. 2B shows operation of the multi-mode amplifier in the AC-coupled mode.

FIG. 2B shows operation of multi-mode amplifier 200 in an AC-coupled mode, which may also be referred to as a capacitor-coupled mode, a legacy mode, a legacy capacitor-coupled mode, etc. In the AC-coupled mode, multi-mode amplifier 200 may operate between the upper power supply $V_{DD}$ and a circuit ground $V_{SS}$ and may drive output load 150 via an AC-coupling capacitor 140. The AC-coupled mode may be used to reduce power consumption.

The ability of multi-mode amplifier 200 to support both the DC-coupled and AC-coupled modes for headphone amplifier 130 and/or other output amplifiers may be desirable for several reasons. First, multi-mode amplifier 200 may be used by a wider customer base. Each customer can operate the multi-mode amplifier in either the DC-coupled mode or the AC-coupled mode based on that customer's preference for lower power consumption or reduced component count and cost. Second, multi-mode amplifier 200 can avoid the need to have two separate output amplifiers—one output amplifier with DC-coupled output and another output amplifier with AC-coupled output.

Multi-mode amplifier 200 may have a particular input common-mode voltage $V_{CM-IN}$, a particular internal common-mode voltage $V_{CM-INT}$, and a particular output common-mode voltage $V_{CM-OUT}$. A common-mode voltage is an average or DC voltage for a single-ended signal or a differential signal. Different power supply voltages and different common-mode voltages may be used for the DC-coupled and AC-coupled modes in order to achieve the desired signal swing.

Figure 3:
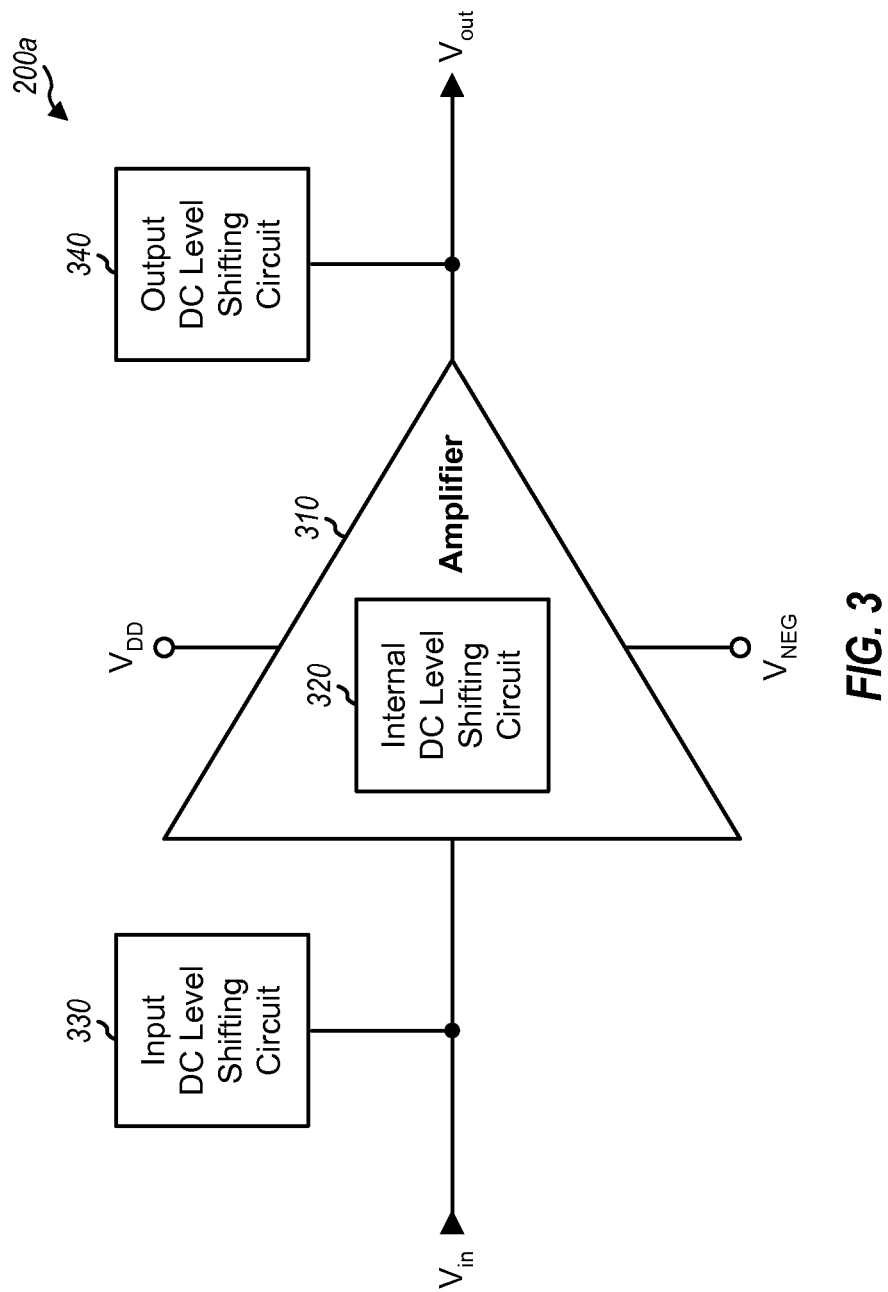
FIG. 3 shows a design of the multi-mode amplifier.

FIG. 3 shows a block diagram of a multi-mode amplifier 200a that supports the DC-coupled and AC-coupled modes. Multi-mode amplifier 200a is one design of multi-mode amplifier 200 in FIGS. 2A and 2B and may be used for headphone amplifier 130 in FIG. 1. In this design, multi-mode amplifier 200a includes an amplifier 310, an input DC level shifting circuit 330, and an output DC level shifting circuit 340. Amplifier 310 operates between $V_{DD}$ and a lower power supply $V_{EE}$, where $V_{EE}=V_{NEG}$ for the DC-coupled mode and $V_{EE}=V_{SS}$ for the AC-coupled mode. Circuit 330 may perform DC level shifting, as needed, such that a desired input common-mode voltage can be obtained for each of the DC-coupled and AC-coupled modes. Similarly, circuit 340 may perform DC level shifting, as needed, such that a desired output common-mode voltage can be obtained for each mode. Amplifier 310 includes an internal DC level shifting circuit 320 that may perform DC level shifting, as needed, such that a desired internal common-mode voltage can be obtained for each mode.

In general, input DC level shifting circuit 330 may be used to obtain different input common-mode voltages for the two modes or may be omitted if the same input common-mode voltage is used for the two modes. Output DC level shifting circuit 340 may be used to obtain different output common-mode voltages for the two modes or may be omitted if the same output common-mode voltage is used for the two modes. Internal DC level shifting circuit 320 may be used to obtain different internal common-mode voltages for the two modes or may be omitted if the same internal common-mode voltage is used for the two modes.

Table 1 gives the power supplies and the common-mode voltages for multi-mode amplifier 200a for the DC-coupled and AC-coupled modes in accordance with one design.

TABLE 1

| Parameter | Symbol | DC-coupled Mode | AC-coupled Mode |
|---|---|---|---|
| Upper power supply | $V_{DD}$ | $V_{DD}$ | $V_{DD}$ |
| Lower power supply | $V_{EE}$ | $V_{NEG}$ | $V_{SS}$ |
| Input common-mode voltage | $V_{CM-IN}$ | $V_{CM}$ | $V_{CM}$ |
| Internal common-mode voltage | $V_{CM-INT}$ | $V_{SS}$ | $V_{CM}$ |
| Output common-mode voltage | $V_{CM-OUT}$ | $V_{SS}$ | $V_{CM}$ |

In the design shown in Table 1, the same input common-mode voltage is used for both modes, and different internal and output common-mode voltages are used for the two modes. In this design, DC level shifting circuits 320 and 340 may be used to obtain different internal and output common-mode voltages for the two modes. DC level shifting circuit 330 may be omitted since the same input common-mode voltage is used for the two modes.

In general, $V_{DD}$, $V_{EE}$, $V_{CM-IN}$, $V_{CM-INT}$ and $V_{CM-OUT}$ may each be the same value or different values for the two modes. Furthermore, any suitable voltages may be used for $V_{DD}$, $V_{EE}$, $V_{CM-IN}$, $V_{CM-INT}$ and $V_{CM-OUT}$ for each mode. The voltages may be selected based on various factors such as the available power supply voltages, the desired output signal swing, the desired power consumption, the integrated circuit (IC) process used to fabricate the multi-mode amplifier, etc. In one specific design, $V_{DD}=2.1$ volts (V), $V_{NEG}=-1.8V$, $V_{SS}=0V$, and $V_{CM}=1.0V$. Other voltages may also be used for $V_{DD}$, $V_{NEG}$, $V_{SS}$ and $V_{CM}$.

In one design, a decision to operate multi-mode amplifier 200 in the DC-coupled mode or the AC-coupled mode may be made during the design phase of an electronics device (e.g., a cellular phone) in which the multi-mode amplifier is used. The lower power supply $V_{EE}$ for amplifier 310 may then be coupled directly to either a power bus for $V_{NEG}$ or circuit ground $V_{SS}$ depending on the selected mode. This direct connection of $V_{EE}$ may reduce voltage drop across the connection and may improve the performance of amplifier 310. In another design, $V_{EE}$ for amplifier 310 may be coupled to either $V_{NEG}$ or $V_{SS}$ via a power switch, which may be controlled based on the selected mode. This design may allow for dynamic switching between the DC-coupled and AC-coupled modes.

Figure 4:
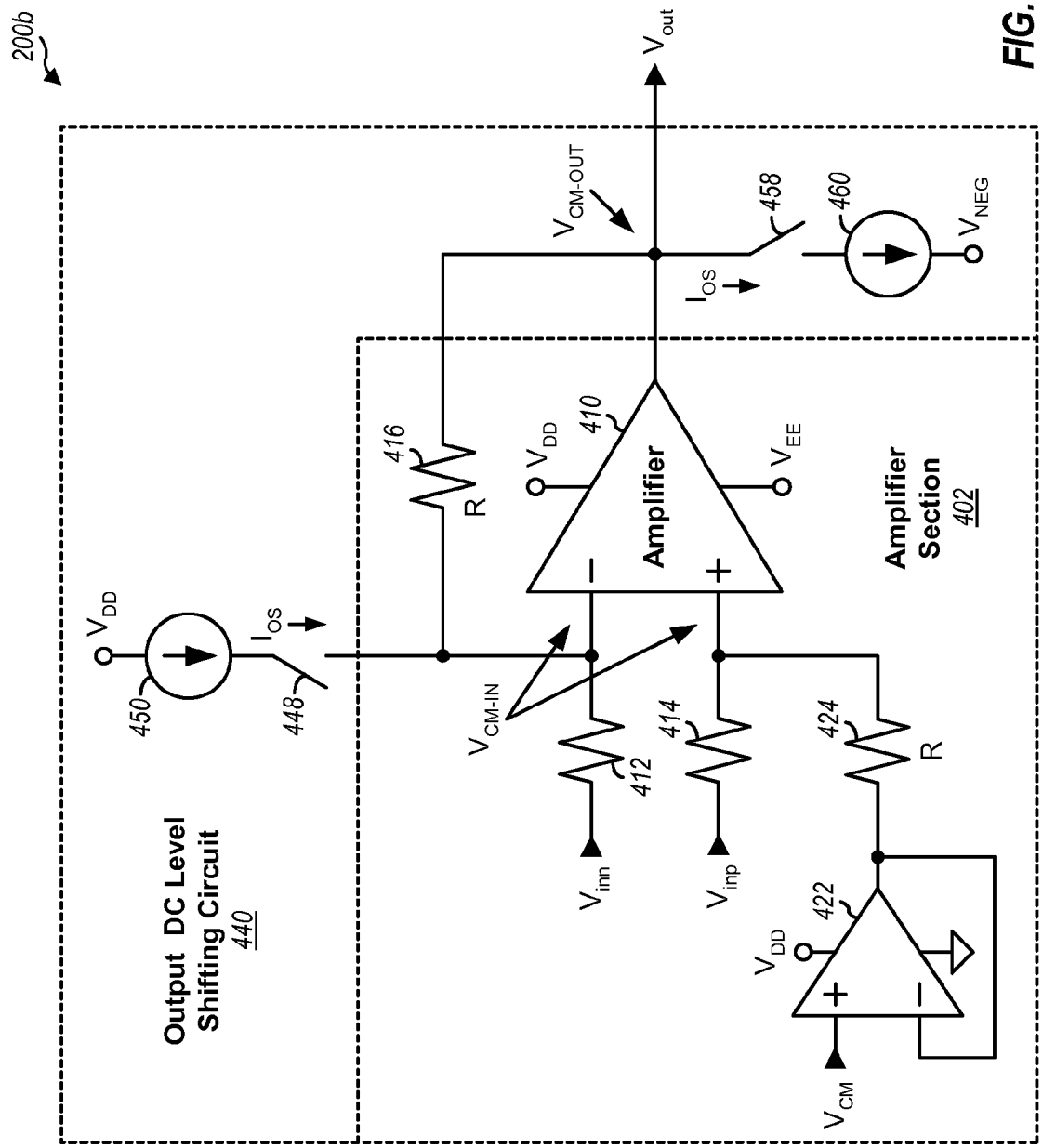
FIG. 4 shows another design of the multi-mode amplifier.

FIG. 4 shows a schematic diagram of a multi-mode amplifier 200b that supports the DC-coupled and AC-coupled modes. Multi-mode amplifier 200b is another design of multi-mode amplifier 200 in FIGS. 2A and 2B and may also be used for headphone amplifier 130 in FIG. 1. In this design, multi-mode amplifier 200b includes an amplifier section 402 and an output DC level shifting circuit 440. Within amplifier section 402, an amplifier 410 operates between $V_{DD}$ and $V_{EE}$, where $V_{EE}$ is dependent on whether the DC-coupled or AC-coupled mode is selected. A resistor 412 has one end receiving a $V_{inn}$ input signal and the other end coupled to an inverting input of amplifier 410. A resistor 414 has one end receiving a $V_{inp}$ input signal and the other end coupled to a non-inverting input of amplifier 410. A feedback resistor 416 is coupled between the inverting input and the output of amplifier 410. An operational amplifier (op-amp) 422 is coupled as a unity gain buffer and receives and buffers the common-mode voltage $V_{CM}$. A resistor 424 is coupled between the output of op-amp 422 and the non-inverting input of amplifier 410.

Within output DC level shifting circuit 440, a current source 450 is coupled in series with a switch 448, and the combination is coupled between $V_{DD}$ and the inverting input of amplifier 410. A switch 458 is coupled in series with a current source 460, and the combination is coupled between the output of amplifier 410 and $V_{NEG}$.

Multi-mode amplifier 200b operates as follows. Op-amp 422 sets the input common-mode voltage of amplifier 410 to $V_{CM}$. Amplifier 410 receives a differential input signal composed of the $V_{inp}$ and $V_{inn}$ signals and provides a single-ended output signal $V_{out}$. DC level shifting circuit 440 sets the output common-mode voltage of amplifier 410 to 0V in the DC-coupled mode and to $V_{CM}$ in the AC-coupled mode. In the DC-coupled mode, switches 448 and 458 are closed, and an offset current of $I_{OS}=V_{CM}/R$ from current source 450 flows through feedback resistor 416 and causes a voltage drop of $V_{CM}$ across resistor 416, which then results in the output of amplifier 410 being at 0V. Current source 460 draws the $I_{OS}$ current from the output of amplifier 410 to $V_{NEG}$ so that this $I_{OS}$ current is not provided to the output signal $V_{out}$. In the AC-coupled mode, switches 448 and 458 are opened, and the output common-mode voltage is equal to the input common-mode voltage due to feedback resistor 416.

Figure 5A:
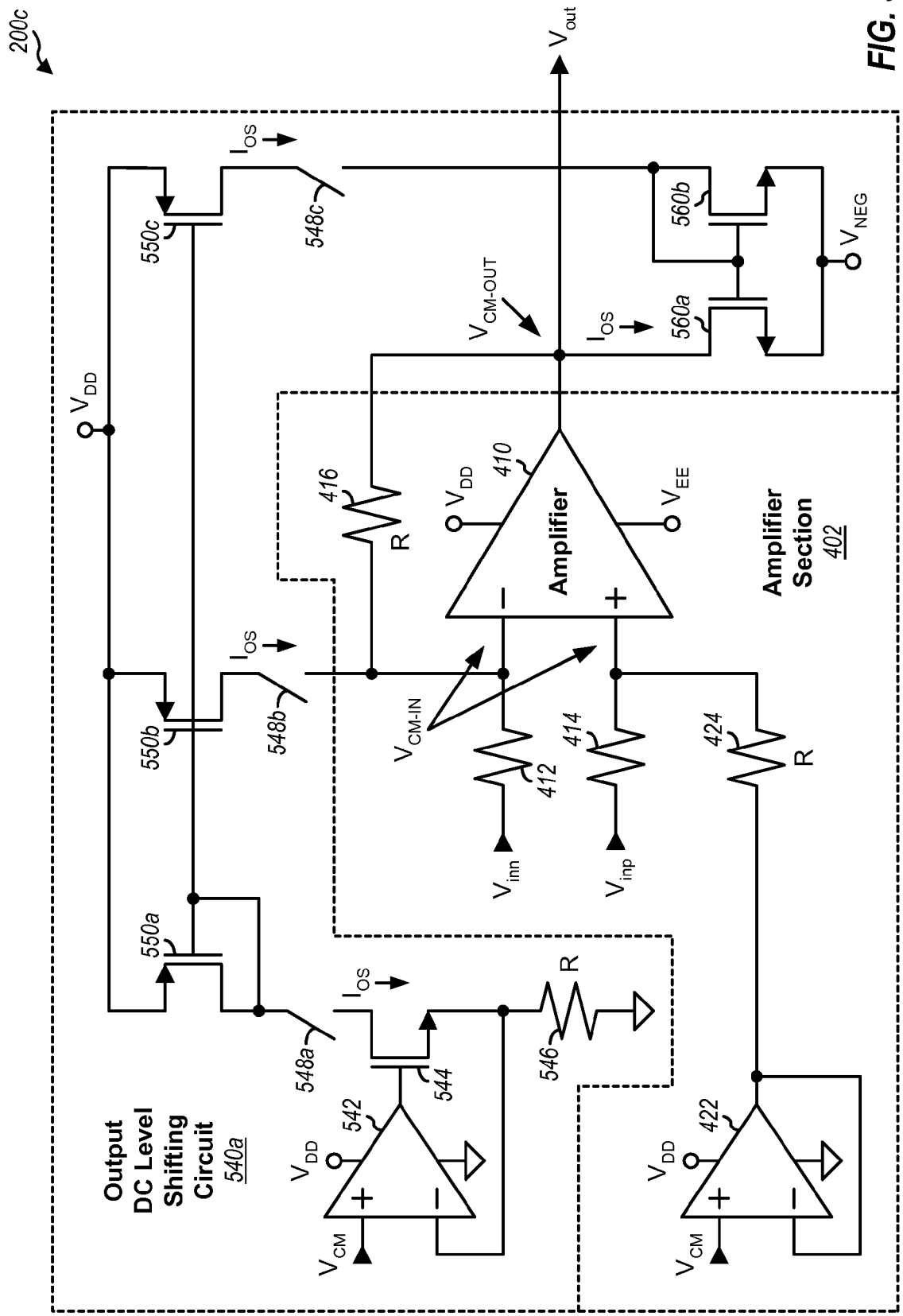
FIGS. 5A and 5B show two additional designs of the multi-mode amplifier.

FIG. 5A shows a schematic diagram of a multi-mode amplifier 200c, which is one design of multi-mode amplifier 200b in FIG. 4. In this design, multi-mode amplifier 200c includes amplifier section 402 and an output DC level shifting circuit 540a. Amplifier section 402 is described above for FIG. 4.

Within output DC level shifting circuit 540a, an op-amp 542 receives the $V_{CM}$ voltage at a non-inverting input. An N-channel field effect transistor (N-FET) 544 has its gate coupled to the output of op-amp 542 and its source coupled to an inverting input of op-amp 542. A resistor 546 is coupled between the source of N-FET 544 and circuit ground. P-channel FETs (P-FETs) 550a, 550b and 550c are coupled as a PMOS current mirror and have their sources coupled to $V_{DD}$ and their gates coupled together and to the drain of P-FET 550a. A switch 548a is coupled between the drain of P-FET 550a and the drain of N-FET 544. A switch 548b is coupled between the drain of P-FET 550b and the inverting input of op-amp 410. N-FETs 560a and 560b are coupled as an NMOS current mirror and have their sources coupled to $V_{NEG}$ and their gates coupled together and to the drain of N-FET 560b. A switch 548c is coupled between the drain of P-FET 550c and the drain of N-FET 560b. The drain of N-FET 560a is coupled to the output of amplifier 410.

DC level shifting circuit 540a sets the output common-mode voltage of amplifier 410 to 0V in the DC-coupled mode and to $V_{CM}$ in the AC-coupled mode. In the DC-coupled mode, switches 548a, 548b and 548c are closed, a current of $I_{OS}=V_{CM}/R$ is generated through resistor 546, and this $I_{OS}$ current flows through each of P-FETs 550a, 550b and 550c due to the PMOS current mirror configuration. The $I_{OS}$ current from P-FET 550b flows through feedback resistor 416 and causes a voltage drop of $V_{CM}$ across resistor 416, which then results in the output of amplifier 410 being at 0V. The $I_{OS}$ current from P-FET 550c flows through N-FET 560b, and a current of $I_{OS}$ also flows through N-FET 560a due to the NMOS current mirror configuration. N-FET 560a thus draws the $I_{OS}$ current from P-FET 550b to $V_{NEG}$ so that this $I_{OS}$ current is not provided to the output signal $V_{out}$. In the AC-coupled mode, switches 548a, 548b and 548c are opened, and the output common-mode voltage is equal to the input common-mode voltage due to feedback resistor 416.

Figure 5B:
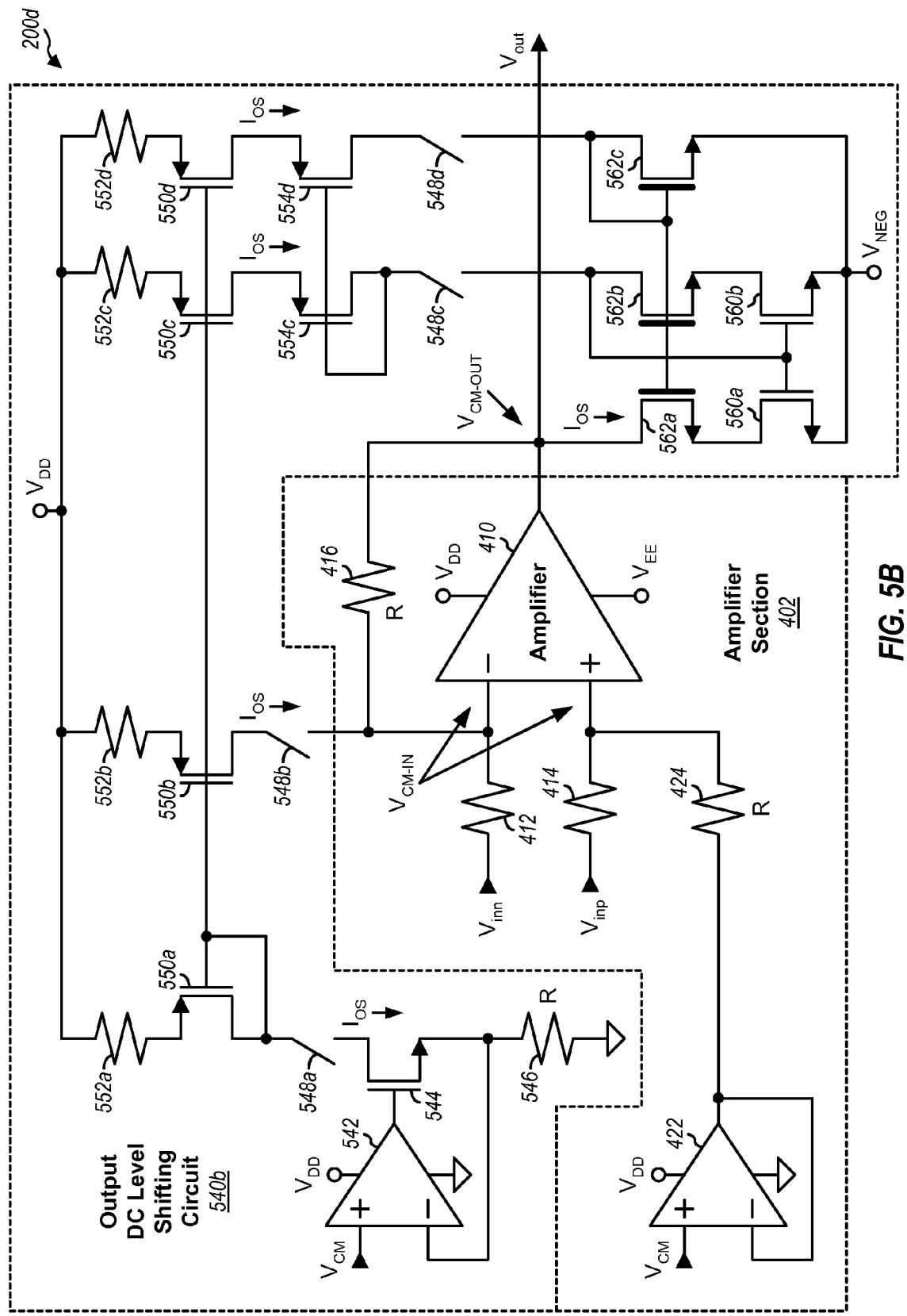

FIG. 5B shows a schematic diagram of a multi-mode amplifier 200d, which is another design of multi-mode amplifier 200b in FIG. 4. In this design, multi-mode amplifier 200d includes amplifier section 402 and an output DC level shifting circuit 540b. Amplifier section 402 is described above for FIG. 4. DC level shifting circuit 540b includes all of the circuit components in DC level shifting circuit 540a in FIG. 5A as well as some additional circuit components.

Within DC level shifting circuit 540b, the PMOS current mirror further includes a P-FET 550d coupled in parallel with P-FET 550c. Resistors 552a, 552b, 552c and 552d are coupled between $V_{DD}$ and the sources of P-FETs 550a, 550b, 550c and 550d, respectively. P-FETs 554c and 554d have their sources coupled to the drains of P-FETs 550c and 550d, respectively, and their gates coupled together and to the drain of P-FET 554c. The NMOS current mirror further includes N-FETs 562a, 562b and 562c having their gates coupled together. N-FET 562a has its source coupled to the drain of N-FET 560a and its drain coupled to the output of amplifier 410. N-FET 562b has its source coupled to the drain of N-FET 560b and its drain coupled to the gates of N-FETs 560a and 560b. N-FET 562c has its source coupled to $V_{NEG}$ and its gate coupled to its drain. Switches 548c and 548d are coupled between the drains of P-FETs 554c and 554d and the drains of N-FETs 562b and 562c, respectively.

Resistors 552a through 552d provide source degeneration, which may reduce noise. P-FETs 554c and 554d are cascode transistors used to reduce the drain-to-source voltage $V_{ds}$ across P-FETs 550c, 550d, 554c and 554d. N-FETs 562a, 562b and 562c are thick-oxide transistors that are able to handle a larger $V_{ds}$. For example, the $V_{out}$ signal may swing from +1.414V to −1.414V, the $V_{ds}$ of N-FET 562a may be greater than 2.2V, and the use of thick-oxide may allow N-FET 562a to handle this larger $V_{ds}$. In one design, $V_{DD}-V_{NEG}=3.9V$, and the break down voltage of the thick-oxide transistors is greater than 6V in order to provide some margins. In the figures, the thick-oxide transistors are indicated by darker vertical bars at their gates. The additional P-FETs and N-FETs in DC level shifting circuit 540b may improve reliability.

In one design, switches 548c and 548d are implemented with FETs of sufficient length (e.g., greater than 0.5 µm) in order to keep the shift in threshold voltage $V_t$ below a desired percentage (e.g., 20%) over the expected lifetime (e.g., 5 years) of the multi-mode amplifier. Switches 548c and 548d may also be designed to handle large gate-to-source voltage $V_{gs}$ and $V_{ds}$ greater than $V_{DD}-V_{NEG}$ (e.g., 4.1V).

FIGS. 4, 5A and 5B show example designs in which a desired output common-mode voltage is obtained by controlling the amount of DC current flowing through feedback resistor 416. The desired output common-mode voltage may also be obtained with other DC level shifting circuit designs.

Figure 6:
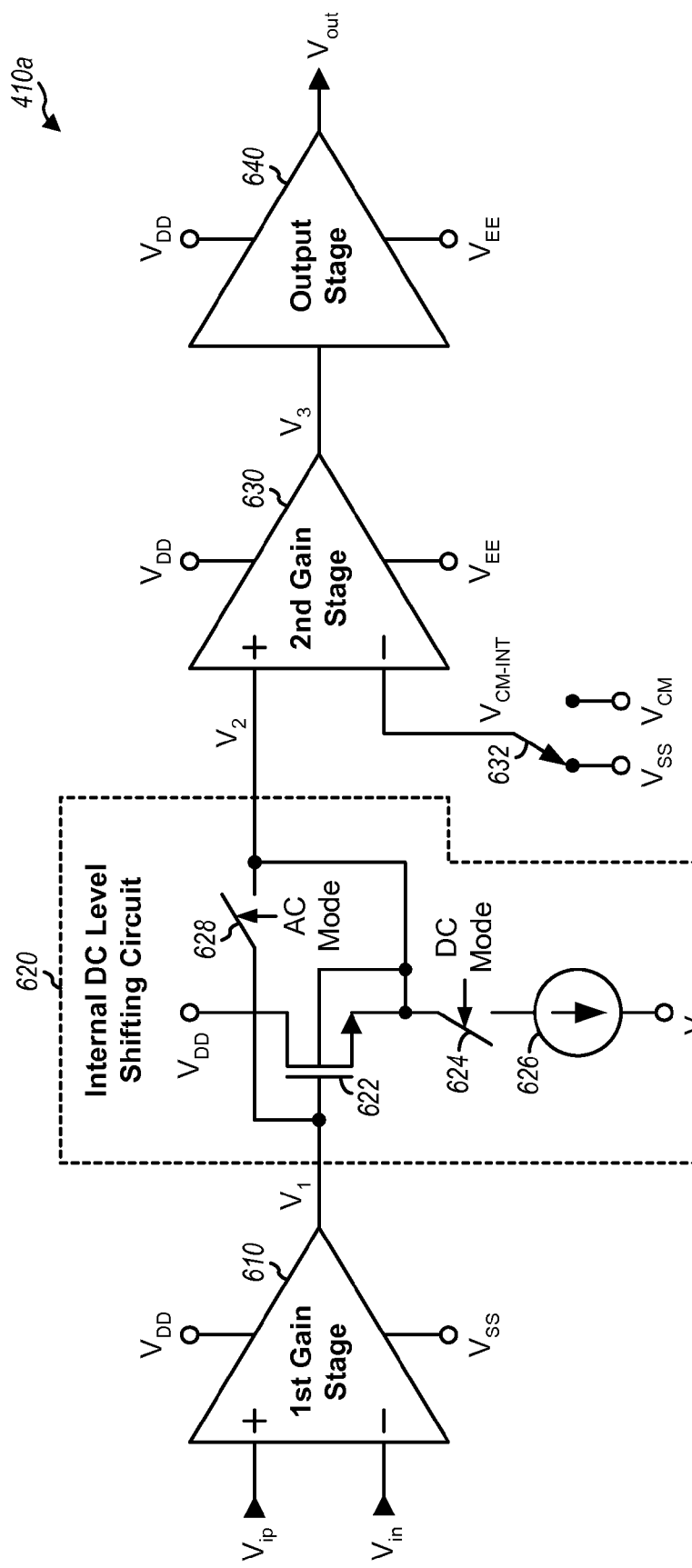
FIGS. 6 and 7 show two designs of an amplifier within the multi-mode amplifier.

FIG. 6 shows a schematic diagram of an amplifier 410a, which is one design of amplifier 410 in FIGS. 4, 5A and 5B. In this design, amplifier 410a includes a first gain stage 610, an internal DC level shifting circuit 620, a second gain stage 630, and an output stage 640. First gain stage 610 receives a differential input signal composed of $V_{ip}$ and $V_{in}$ input signals and provides a $V_1$ output signal. First gain stage 610 operates between $V_{DD}$ and $V_{SS}$ and has an input common-mode voltage of $V_{CM}$ for both the DC-coupled and AC-coupled modes. The input common-mode voltage $V_{CM}$ is set by op-amp 422 in FIG. 4.

Within DC level shifting circuit 620, an N-FET 622 has its gate receiving the $V_1$ signal from first gain stage 610, its drain coupled to $V_{DD}$, and its source providing a $V_2$ output signal. A switch 624 and a current source 626 are coupled in series, and the combination is coupled between the source of N-FET 622 and $V_{NEG}$. A switch 628 is coupled between the gate and source of N-FET 622. In the DC-coupled mode, switch 624 is closed, switch 628 is opened, and DC level shifting circuit 620 shifts the DC level of the $V_1$ signal down to $V_{SS}$ via N-FET 622 and provides the DC-shifted $V_1$ signal as the $V_2$ signal. The amount of DC shift may be determined based on the size of N-FET 622 and the amount of bias current from current source 626. In the AC-coupled mode, switch 624 is opened, switch 628 is closed, and DC level shifting circuit 620 passes the $V_1$ signal via switch 628 as the $V_2$ signal.

Second gain stage 630 receives the $V_2$ signal from DC level shifting circuit 620 and an internal common-mode voltage $V_{CM-INT}$ from a switch 632 and provides a $V_3$ output signal. Switch 632 provides $V_{SS}$ in the DC-coupled mode and provides $V_{CM}$ in the AC-coupled mode. In the DC-coupled mode, second gain stage 630 operates between $V_{DD}$ and $V_{NEG}$, and the common-mode voltage at the input of second gain stage 630 is equal to $V_{SS}$ from switch 632. In the AC-coupled mode, second gain stage 630 operates between $V_{DD}$ and $V_{SS}$, and the common-mode voltage at the input of second gain stage 630 is equal to $V_{CM}$ from switch 632. Output stage 640 receives the $V_3$ signal from second gain stage 630 and provides the output signal $V_{out}$ for amplifier 410. Output stage 640 operates between $V_{DD}$ and $V_{EE}$, with $V_{EE}$ being dependent on the selected mode.

In the design shown in FIG. 6, first gain stage 610 operates between the same supplies of $V_{DD}$ and $V_{SS}$ for both the DC-coupled and AC-coupled modes whereas second gain stage 630 and output stage 640 operate between supplies of $V_{DD}$ and $V_{NEG}$ in the DC-coupled mode and between supplies of $V_{DD}$ and $V_{SS}$ in the AC-coupled mode. DC level shifting circuit 620 is used to vary the common-mode voltage at the input of second gain stage 630 to match the change in the supplies for the second gain stage.

Figure 7:
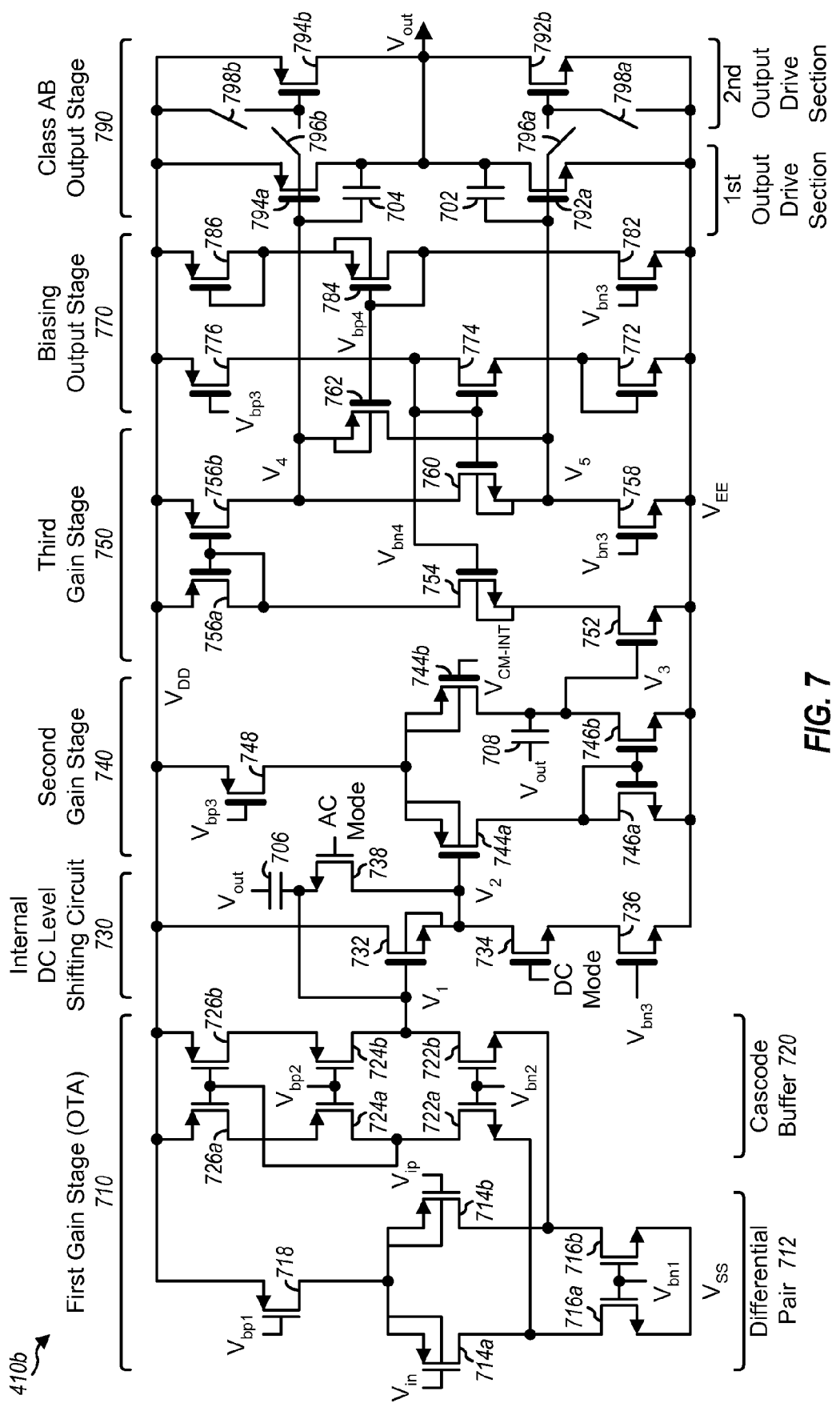

FIG. 7 shows a schematic diagram of an amplifier 410b, which is another design of amplifier 410 in FIGS. 4, 5A and 5B. In this design, amplifier 410b includes a first gain stage 710, an internal DC level shifting circuit 730, a second gain stage 740, a third gain stage 750, a biasing output stage 770, and a class AB output stage 790.

First gain stage 710 implements an operational transconductance amplifier (OTA) and includes a differential pair 712 and a cascode buffer 720. Within differential pair 712, P-FETs 714a and 714b have their gates receiving the $V_{in}$ and $V_{ip}$ input signals, respectively, and their sources coupled together. N-FETs 716a and 716b have their sources coupled to $V_{SS}$, their gates receiving a $V_{bn1}$ bias voltage, and their drains coupled to the drains of P-FETs 714a and 714b, respectively. A P-FET 718 has its source coupled to $V_{DD}$, its gate receiving a $V_{bp1}$ bias voltage, and its drain coupled to the sources of P-FETs 714 and 714b. P-FET 718 functions as a current source. P-FETs 714a and 714b operate as a differential pair. N-FETs 716a and 716b provide an active load for the differential pair.

Within cascode buffer 720, N-FETs 722a and 722b have their sources coupled to the drains of N-FETs 716a and 716b, respectively, and their gates receiving a $V_{bn2}$ bias voltage. P-FETs 724a and 724b have their drains coupled to the drains of N-FETs 722a and 722b, respectively, and their gates receiving a $V_{bp2}$ bias voltage. P-FETs 726a and 726b have their sources coupled to $V_{DD}$, their gates coupled together and to the drain of P-FET 724a, and their drains coupled to the sources of P-FETs 724a and 724b, respectively. The drains of FETs 722b and 724b provide a $V_1$ output signal for first gain stage 710.

Within DC level shifting circuit 730, N-FETs 732, 734 and 736 are stacked and coupled between $V_{DD}$ and $V_{NEG}$. N-FET 732 has its drain coupled to $V_{DD}$, its gate receiving the $V_1$ signal from first gain stage 710, and its source coupled to the drain of N-FET 734. N-FET 734 has its gate receiving a DC Mode signal, and its source coupled to the drain of N-FET 736. N-FET 736 has its gate receiving a $V_{bn3}$ bias voltage and its source coupled to $V_{EE}$. An N-FET 738 has its source coupled to the gate of N-FET 732, its gate receiving an AC Mode signal, and its drain coupled to the source of N-FET 732. N-FET 732 performs DC level shifting of the $V_1$ signal. N-FETs 734 and 738 correspond to switches 624 and 628, respectively, in FIG. 6. N-FET 736 corresponds to current source 626 in FIG. 6. The source of N-FET 732 provides a $V_2$ output signal for DC level shifting circuit 730. The DC Mode and AC Mode signals may be designed for operation between $V_{DD}$ and $V_{EE}$ and may be obtained by level shifting digital control signals.

Second gain stage 740 includes P-FETs 744a, 744b and 748 and N-FETs 746a and 746b that are coupled in similar manner as P-FETs 714a, 714b and 718 and N-FETs 716a and 716b in first gain stage 710. P-FET 744a receives the $V_2$ signal at its gate, P-FET 744b receives the $V_{CM\text{-}INT}$ voltage at its gate, and P-FET 748 receives a $V_{bp3}$ bias voltage at its gate. The drains of FETs 744b and 746b provide a $V_3$ output signal for second gain stage 740.

Within third gain stage 750, an N-FET 752 has its source coupled to $V_{EE}$ and its gate receiving the $V_3$ signal. An N-FET 754 has its source coupled to the drain of N-FET 752, its gate receiving a $V_{bn4}$ bias voltage, and its drain coupled to the drain of a P-FET 756a. P-FETs 756a and 756b have their sources coupled to $V_{DD}$ and their gates coupled together and to the drain of P-FET 756a. The drain of P-FET 756b provides a $V_4$ signal. An N-FET 758 has its source coupled to $V_{EE}$, its gate receiving the $V_{bn3}$ bias voltage, and its drain providing a $V_5$ signal. An N-FET 760 has its source coupled to the drain of N-FET 758, its gate receiving the $V_{bn4}$ bias voltage, and its drain coupled to the drain of P-FET 756b. A P-FET 762 has its source coupled to the drain of P-FET 756b, its gate receiving a $V_{bp4}$ bias voltage, and its drain coupled to the drain of N-FET 758. N-FET 752 operates as a common source amplifier. N-FET 754 functions as a cascode buffer. P-FETs 756a and 756b operate as a PMOS current mirror load. N-FET 760 and P-FET 762 are floating voltage sources that provide the $V_4$ and $V_5$ signals to drive output stage 790.

Within biasing output stage 770, FETs 772, 774 and 776 are stacked and coupled between $V_{DD}$ and $V_{EE}$. N-FET 772 has its source coupled to $V_{EE}$ and its gate coupled to its drain. N-FET 774 has its source coupled to the drain of N-FET 772 and its gate coupled to its drain, which provides the $V_{bn4}$ bias voltage. P-FET 776 has its source coupled to $V_{DD}$, its gate receiving the $V_{bp3}$ bias voltage, and its drain coupled to the drain of N-FET 774. N-FET 782 has its source coupled to $V_{EE}$ and its gate receiving the $V_{bn3}$ bias voltage. P-FET 784 has its gate and drain coupled to the drain of N-FET 782 and its drain providing the $V_{bp4}$ bias voltage. P-FET 786 has its source coupled to $V_{DD}$, its gate coupled to its drain, and its drain coupled to the source of P-FET 784. The FETs within biasing output stage 770 provide the $V_{bn4}$ and $V_{bp4}$ bias voltages for third gain stage 750.

Within class AB output stage 790, N-FETs 792a and 792b have their sources coupled to $V_{EE}$ and their drains coupled to an output node that provides the output signal $V_{out}$. The gate of N-FET 792a receives the $V_5$ signal directly whereas the gate of N-FET 792b receives the $V_5$ signal via a switch 796a. A switch 798a is coupled between the gate of N-FET 792b and $V_{EE}$. P-FETs 794a and 792b have their sources coupled to $V_{DD}$ and their drains coupled to the output node. The gate of P-FET 794a receives the $V_4$ signal directly whereas the gate of P-FET 794b receives the $V_4$ signal via a switch 796b. A switch 798b is coupled between the gate of P-FET 794b and $V_{DD}$. Each pair of FETs 792 and 794 form an output drive section that provides signal drive for the $V_{out}$ signal.

In the design shown in FIG. 7, different numbers of output drive sections are used for the DC-coupled and AC-coupled modes. In the DC-coupled mode, output stage 790 operates with a larger supply between $V_{DD}$ and $V_{EE}$, the transconductances $g_m$ of FETs 792a and 794a are higher, and FETs 792a and 794a can provide the desired output drive. FETs 792b and 794b may be disabled by opening switches 796a and 796b and closing switches 798a and 798b. In the AC-coupled mode, output stage 790 operates with a smaller supply between $V_{DD}$ and $V_{SS}$, the transconductances of FETs 792a and 794a are smaller, and FETs 792a and 794a as well as FETs 792b and 794b are used to provide the desired output drive. FETs 792b and 794b may be enabled by closing switches 796a and 796b and opening switches 798a and 798b. In general, any number of FET pairs for any number of output drive sections may be used to provide the desired signal drive for each of the DC-coupled and AC-coupled modes.

Capacitors 702, 704, 706 and 708 are compensation capacitors used to ensure stability of amplifier 410b. Capacitor 702 is coupled between the gate and drain of N-FET 792a. Capacitor 704 is coupled between the gate and drain of P-FET 794a. Capacitor 706 is coupled between the output node and the gate of N-FET 732. Capacitor 708 is coupled between the output node and the gate of N-FET 752. The compensation may attempt to separate the poles from each of the gain stages sufficiently far apart in order to obtain the desired gain and phase margin in both of the DC-coupled and AC-coupled modes. In addition, the compensation capacitor for a given stage (e.g., capacitor 708 for third gain stage 750) may be switched between the two modes.

In one design, first gain stage 710 operates between $V_{DD}=2.1V$ and $V_{SS}=0V$ and is implemented with thin-oxide FETs. The subsequent stages operate between $V_{DD}=2.1V$ and $V_{NEG}=-1.8V$ and are implemented with thick-oxide FETs having a higher operating voltage than the thin-oxide FETs. The thick-oxide FETs are shown with darker vertical bars at their gates. The N-FETs coupled to $V_{NEG}$ may be isolated from the substrate using a deep N-well. Some of the thick-oxide FETs (e.g., N-FET 760 and P-FET 762) may have their bulk tied to their sources in order to combat bulk effect in the AC-coupled mode.

In one design, amplifiers 410a and 410b operate between $V_{DD}=2.1V$ and $V_{NEG}=-1.8V$ in the DC-coupled mode and can provide a maximum output signal swing of 1 Vrms with an output common-mode voltage of $V_{CM}=0V$ into a load of 16 ohms (Ω). In one design, amplifiers 410a and 410b operate between $V_{DD}=2.1V$ and $V_{SS}=0V$ in the AC-coupled mode and can provide a maximum output signal swing of 0.58 Vrms with an output common-mode voltage of $V_{CM}=1V$ into the 16Ω load. Amplifiers 410a and 410b may also be operated with other $V_{DD}$ and $V_{EE}$ voltages and may be able to provide other output signal levels for the DC-coupled and AC-coupled modes.

FIGS. 6 and 7 show example designs of two amplifiers 410a and 410b that can support the DC-coupled and AC-coupled modes. An amplifier supporting these two modes may also be implemented with other designs. In general, an amplifier may have any number of gain stages. A given stage may operate with the same supplies (e.g., $V_{DD}$ and $V_{SS}$) for both the DC-coupled and AC-coupled modes or with different supplies for the two modes (e.g., $V_{DD}$ and $V_{NEG}$ for the DC-coupled mode and $V_{DD}$ and $V_{SS}$ for the AC-coupled mode). The amplifier may or may not employ an internal DC level shifting circuit. If employed, the internal DC level shifting circuit may be used to center the common-mode voltage when different supplies are used for the two modes.

Figure 8:
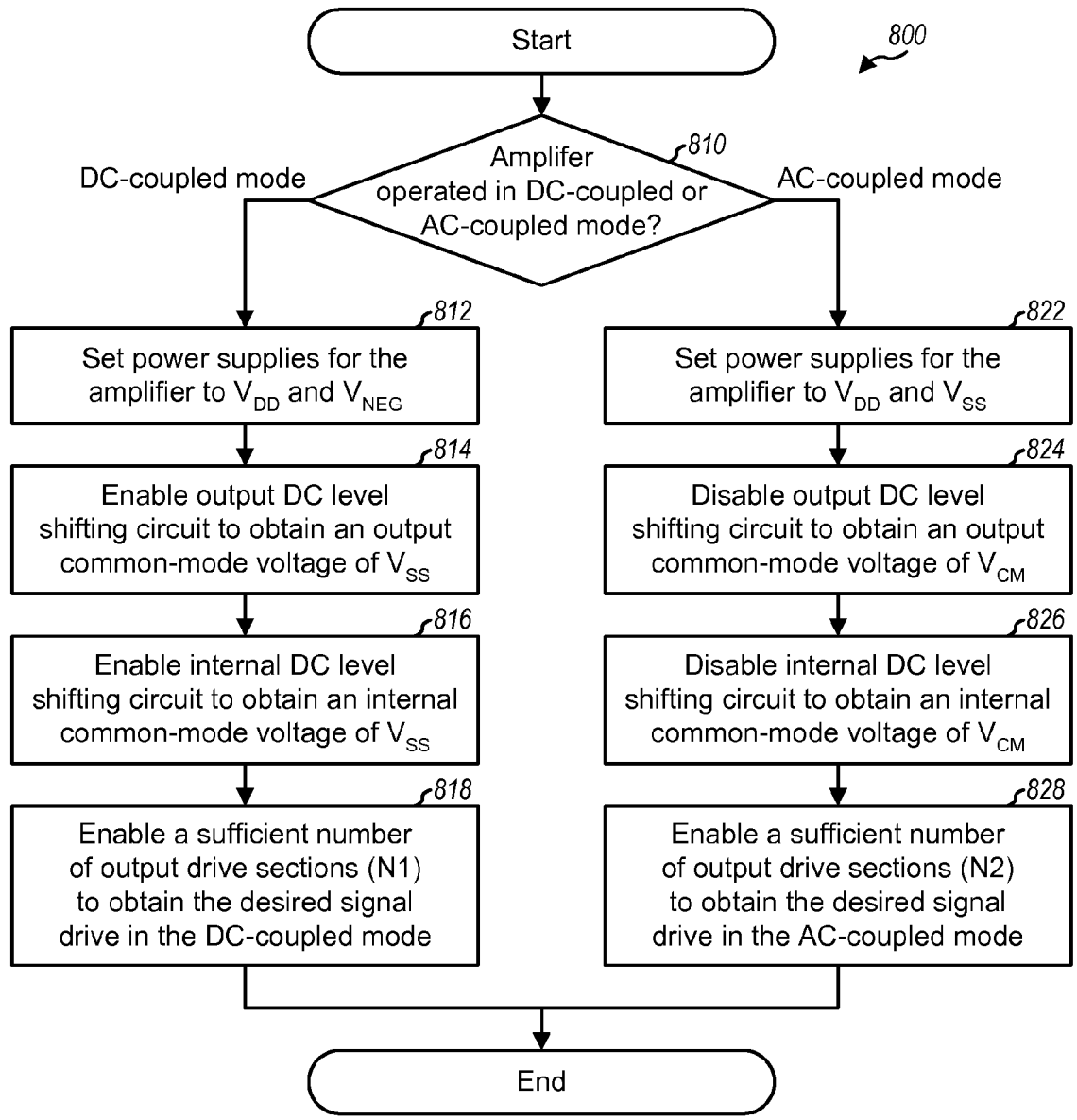
FIG. 8 shows a process for configuring the multi-mode amplifier.

FIG. 8 shows a design of a process 800 for configuring a multi-mode amplifier, e.g., multi-mode amplifier 200a, 200b, 200c or 200d in FIG. 3, 4, 5A or 5B, respectively. A determination is made whether the amplifier is operated in the DC-coupled or AC-coupled mode (block 810). If the amplifier is operated in the DC-coupled mode, then the power supplies for the amplifier may be set to $V_{DD}$ and $V_{NEG}$ (block 812). An output DC level shifting circuit may be enabled to obtain an output common-mode voltage of $V_{SS}$ (block 814). An internal DC level shifting circuit may also be enabled to obtain an internal common-mode voltage of $V_{SS}$ (block 816). A sufficient number of output drive sections (N1) may be enabled to obtain the desired signal drive in the DC-coupled mode (block 818).

If the amplifier is operated in the AC-coupled mode, then the power supplies for the amplifier may be set to $V_{DD}$ and $V_{SS}$ (block 822). The output DC level shifting circuit may be disabled to obtain an output common-mode voltage of $V_{CM}$ (block 824). The internal DC level shifting circuit may also be disabled to obtain an internal common-mode voltage of $V_{CM}$ (block 826). A sufficient number of output drive sections (N2) may be enabled to obtain the desired signal drive in the AC-coupled mode, where N2 may be greater than N1 for the DC-coupled mode (block 828).

FIG. 8 shows a specific design of configuring a multi-mode amplifier in either the DC-coupled or AC-coupled mode. The internal DC level shifting circuit may be omitted if the same internal common-mode voltage is used for both modes. Different and/or additional circuits may also be configured for the two modes. For example, an input DC level shifting circuit may be used to obtain different input common-mode voltages for the two modes, compensation capacitors may be switched between the two modes, etc.

Figure 9:
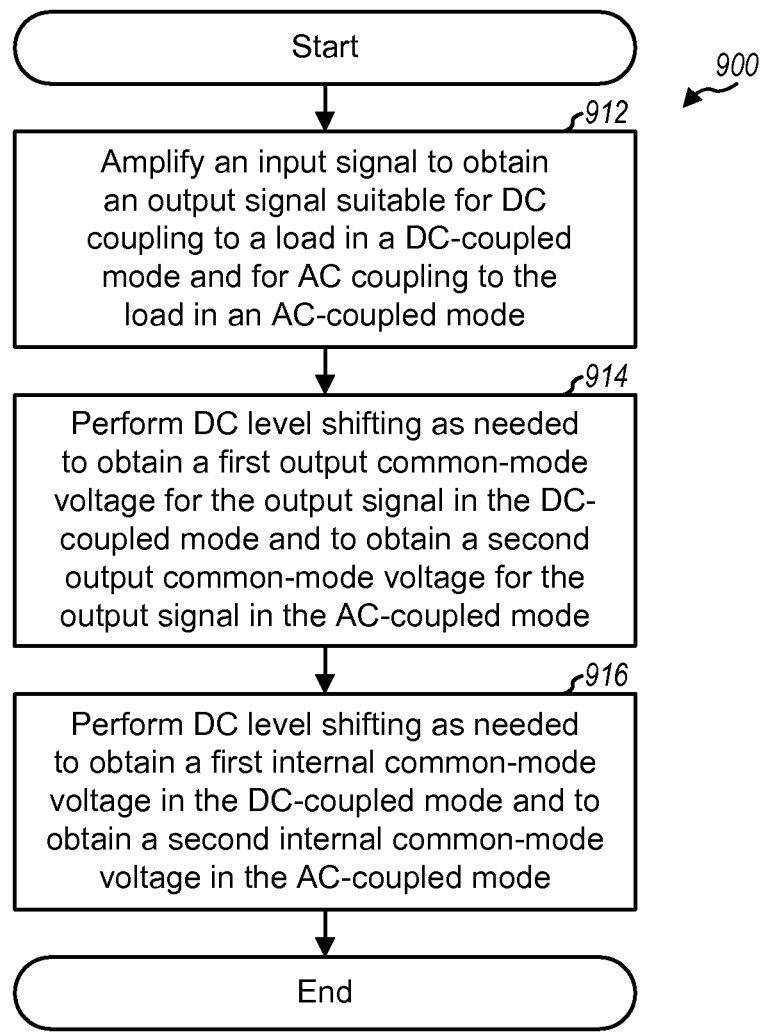
FIG. 9 shows a process for operating the multi-mode amplifier.

FIG. 9 shows a design of a process 900 for operating a multi-mode amplifier, e.g., multi-mode amplifier 200a, 200b, 200c or 200d in FIG. 3, 4, 5A or 5B, respectively. An input signal may be amplified to obtain an output signal that is suitable for DC coupling to a load in the DC-coupled mode and for AC coupling to the load in the AC-coupled mode (block 912). For block 912, the input signal may be amplified using (i) an upper power supply $V_{DD}$ and a first lower power supply $V_{NEG}$ in the DC-coupled mode and (ii) the upper power supply and a second lower power supply $V_{SS}$ in the AC-coupled mode. The output signal may be driven (i) with a first output drive section in both the DC-coupled and AC-coupled modes and (ii) further with a second output drive section in the AC-coupled mode.

DC level shifting may be performed as needed to obtain a first output common-mode voltage (e.g., $V_{SS}$) for the output signal in the DC-coupled mode and to obtain a second output common-mode voltage (e.g., $V_{CM}$) for the output signal in the AC-coupled mode (block 914). For block 914, an offset current may be generated to obtain a DC voltage difference between the input signal and the output signal. The offset current may be drawn to a lower power supply to prevent the offset current from passing to the output signal. DC level shifting may also be performed as needed to obtain a first internal common-mode voltage (e.g., $V_{SS}$) in the DC-coupled mode and to obtain a second internal common-mode voltage (e.g., $V_{CM}$) in the AC-coupled mode (block 916).

The multi-mode amplifier described herein may be used for various applications such as communication, computing, networking, personal electronics, etc. For example, the multi-mode amplifier may be used for wireless communication devices, cellular phones, personal digital assistants (PDAs), handheld devices, gaming devices, computing devices, laptop computers, consumer electronics devices, personal computers, cordless phones, etc. An example use of the multi-mode amplifier in a wireless communication device is described below.

Figure 10:
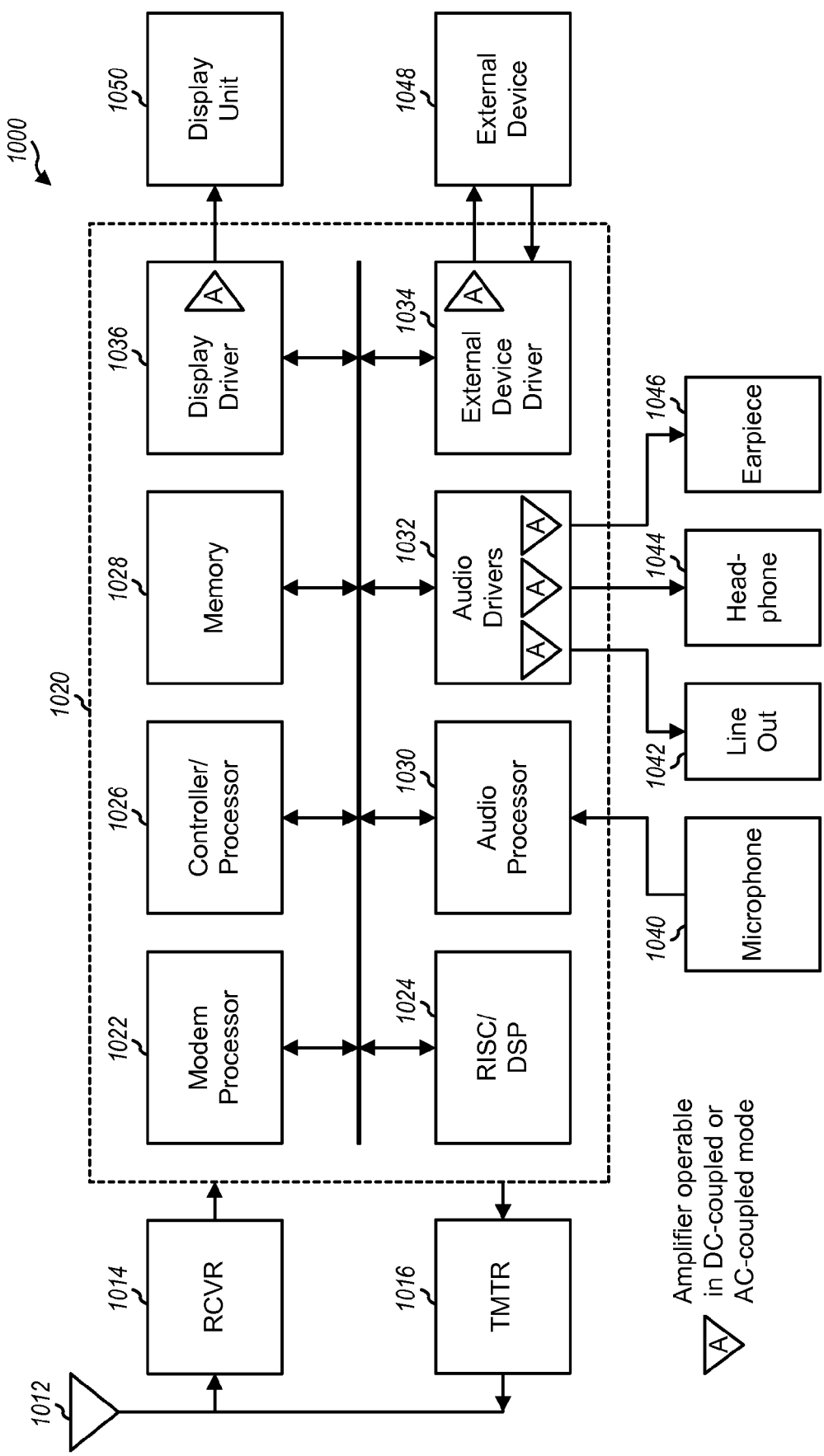
FIG. 10 shows a block diagram of a wireless communication device.

FIG. 10 shows a block diagram of a design of a wireless communication device 1000 for a wireless communication system. Wireless device 1000 may be a cellular phone, a terminal, a handset, a wireless modem, etc. The wireless communication system may be a Code Division Multiple Access (CDMA) system, a Global System for Mobile Communications (GSM) system, etc.

Wireless device 1000 is capable of providing bi-directional communication via a receive path and a transmit path. On the receive path, signals transmitted by base stations may be received by an antenna 1012 and provided to a receiver (RCVR) 1014. Receiver 1014 may condition and digitize the received signal and provide samples to a section 1020 for further processing. On the transmit path, a transmitter (TMTR) 1016 may receive data to be transmitted from section 1020, process and conditions the data, and generate a modulated signal, which may be transmitted via antenna 1012 to the base stations. Receiver 1014 and transmitter 1016 may support CDMA, GSM, etc.

Section 1020 includes various processing, interface, and memory units such as, for example, a modem processor 1022, a reduced instruction set computer/digital signal processor (RISC/DSP) 1024, a controller/processor 1026, a memory 1028, an audio processor 1030, audio drivers 1032, an external device driver 1034, and a display driver 1036. Modem processor 1022 may perform processing for data transmission and reception, e.g., encoding, modulation, demodulation, decoding, etc. RISC/DSP 1024 may perform general and specialized processing for wireless device 1000. Controller/processor 1026 may direct the operation of various units within section 1020. Memory 1028 may store data and/or instructions for various units within section 1020.

Audio processor 1030 may perform encoding for input signals from a microphone 1040 and/or other audio sources. Audio processor 1030 may also perform decoding for coded audio data and may provide audio signals to audio drivers 1032. Audio drivers 1032 may drive a line-out device 1042, a headphone 1044, an earpiece 1046, and/or other audio devices. Audio drivers 1032 may include audio circuit 100 in FIG. 1. External device driver 1034 may drive an external device 1048 and/or may receive signals from the external device. Display driver 1036 may drive a display unit 1050.

As shown in FIG. 10, the multi-mode amplifier may be used in various blocks in which either DC or AC coupling is desirable. For example, the multi-mode amplifier may be used in audio drivers 1032, external device driver 1034, display driver 1036, etc. As a specific example, multi-mode amplifier 200a, 200b, 200c or 200d in FIG. 3, 4, 5A or 5B, respectively, may be used as a headphone amplifier in audio drivers 1032 to drive headphone 1044.

The multi-mode amplifier described herein may be implemented on an IC, an analog IC, a radio frequency IC (RFIC), a mixed-signal IC, an application specific integrated circuit (ASIC), a printed circuit board (PCB), an electronics device, etc. The multi-mode amplifier may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), etc.

An apparatus implementing the multi-mode amplifier described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   an amplifier configured to amplify an input signal and provide an output signal suitable for DC coupling to a load in a DC-coupled mode and for AC coupling to the load in an AC-coupled mode; and
   at least one DC level shifting circuit coupled to the amplifier and configured to perform DC level shifting for at least one common-mode voltage of the amplifier, the at least one DC level shifting circuit being controlled based on whether the amplifier is operating in the DC-coupled mode or the AC-coupled mode and configured to set an output common-mode voltage equal to a ground voltage for coupling to the output signal in the DC-coupled mode and set the output common-mode voltage equal to a common-mode voltage for coupling to the output signal in the AC-coupled mode.

2. The apparatus of claim 1, wherein the at least one DC level shifting circuit comprises an output DC level shifting circuit configured to provide a first output common-mode voltage for the amplifier in the DC-coupled mode and to provide a second output common-mode voltage for the amplifier in the AC-coupled mode.

3. The apparatus of claim 2, wherein the output DC level shifting circuit comprises a first current source configured to provide an offset current in the DC-coupled mode, the offset current being passed through a feedback resistor to an output of the amplifier, and
   a second current source configured to draw the offset current at the output of the amplifier to a lower power supply.

4. The apparatus of claim 1, wherein the at least one DC level shifting circuit comprises an input DC level shifting circuit configured to provide a first input common-mode voltage for the amplifier in the DC-coupled mode and to provide a second input common-mode voltage for the amplifier in the AC-coupled mode.

5. The apparatus of claim 1, wherein the amplifier comprises an internal DC level shifting circuit configured to provide a first internal common-mode voltage for the amplifier in the DC-coupled mode and to provide a second internal common-mode voltage for the amplifier in the AC-coupled mode.

6. The apparatus of claim 1, wherein the amplifier has different input and output common-mode voltages in the DC-coupled mode and equal input and output common-mode voltages in the AC-coupled mode.

7. The apparatus of claim 1, wherein the amplifier has equal internal and output common-mode voltages in both the DC-coupled and AC-coupled modes.

8. The apparatus of claim 1, wherein the amplifier operates between an upper power supply and a first lower power supply in the DC-coupled mode and between the upper power supply and a second lower power supply in the AC-coupled mode.

9. The apparatus of claim 8, wherein the first lower power supply is a negative voltage and the second lower power supply is circuit ground.

10. The apparatus of claim 1, wherein the amplifier comprises
    at least one gain stage configured to provide amplification for the input signal,
    an internal DC level shifting circuit configured to provide a first internal common-mode voltage in the DC-coupled mode and to provide a second internal common-mode voltage in the AC-coupled mode, and an output stage configured to provide signal drive for the output signal.

11. The apparatus of claim 1, wherein the amplifier comprises an input gain stage configured to receive and amplify the input signal, the input gain stage having same input common-mode voltage for both the DC-coupled and AC-coupled modes.

12. The apparatus of claim 11, wherein the input gain stage operates between an upper power supply and circuit ground for both the DC-coupled and AC-coupled modes.

13. The apparatus of claim 1, wherein the amplifier comprises
a first output drive section configured to provide signal drive for the output signal in both the DC-coupled and AC-coupled modes, and
a second output drive section coupled in parallel with the first output drive section and being disabled in the DC-coupled mode and enabled in the AC-coupled mode to provide additional signal drive for the output signal.

14. The apparatus of claim 1, wherein the amplifier comprises
at least one stage implemented with thin-oxide transistors having a first operating voltage, and
at least one additional stage implemented with thick-oxide transistors having a second operating voltage higher than the first operating voltage.

15. The apparatus of claim 1, wherein the amplifier comprises at least one capacitor configured to provide compensation for the amplifier and controlled based on whether the amplifier is operating in the DC-coupled mode or the AC-coupled mode.

16. The apparatus of claim 1, wherein the amplifier is operated as a headphone amplifier and configured to provide the output signal for a headphone.

17. An integrated circuit comprising:
an amplifier configured to amplify an input signal and provide an output signal suitable for DC coupling to a load in a DC-coupled mode and for AC coupling to the load in an AC-coupled mode; and
at least one DC level shifting circuit coupled to the amplifier and configured to perform DC level shifting for at least one common-mode voltage of the amplifier, the at least one DC level shifting circuit being controlled based on whether the amplifier is operating in the DC-coupled mode or the AC-coupled mode and configured to set an output common-mode voltage equal to a ground voltage for coupling to the output signal in the DC-coupled mode and set the output common-mode voltage equal to a common-mode voltage for coupling to the output signal in the AC-coupled mode.

18. The integrated circuit of claim 17, wherein the at least one DC level shifting circuit comprises an output DC level shifting circuit configured to provide a first output common-mode voltage for the amplifier in the DC-coupled mode and to provide a second output common-mode voltage for the amplifier in the AC-coupled mode.

19. The integrated circuit of claim 17, wherein the amplifier comprises an internal DC level shifting circuit configured to provide a first internal common-mode voltage for the amplifier in the DC-coupled mode and to provide a second internal common-mode voltage for the amplifier in the AC-coupled mode.

20. The integrated circuit of claim 17, wherein the amplifier comprises
at least one gain stage configured to provide amplification for the input signal,
an internal DC level shifting circuit configured to provide a first internal common-mode voltage in the DC-coupled mode and to provide a second internal common-mode voltage in the AC-coupled mode, and
an output stage configured to provide signal drive for the output signal.

21. The integrated circuit of claim 17, wherein the amplifier comprises
a first output drive section configured to provide signal drive for the output signal in both the DC-coupled and AC-coupled modes, and
a second output drive section coupled in parallel with the first output drive section and being disabled in the DC-coupled mode and enabled in the AC-coupled mode to provide additional signal drive for the output signal.

22. A wireless communication device comprising:
a headphone amplifier comprising
an amplifier configured to amplify an input signal and provide an output signal suitable for DC coupling to a load in a DC-coupled mode and for AC coupling to the load in an AC-coupled mode, and
at least one DC level shifting circuit coupled to the amplifier and configured to perform DC level shifting for at least one common-mode voltage of the amplifier, the at least one DC level shifting circuit being controlled based on whether the amplifier is operating in the DC-coupled mode or the AC-coupled mode and configured to set an output common-mode voltage and an internal common-voltage voltage equal to a ground voltage for coupling to the output signal in the DC-coupled mode and set the output common-mode voltage equal to a common-mode voltage for coupling to the output signal in the AC-coupled mode.

23. A method comprising:
amplifying an input signal to obtain an output signal suitable for DC coupling to a load in a DC-coupled mode and for AC coupling to the load in an AC-coupled mode; and
performing DC level shifting as needed to obtain a first output common-mode voltage equal to a ground voltage for coupling to the output signal in the DC-coupled mode and to obtain a second output common-mode voltage equal to a common-mode voltage for coupling to the output signal in the AC-coupled mode.

24. The method of claim 23, further comprising:
performing DC level shifting as needed to obtain a first internal common-mode voltage in the DC-coupled mode and to obtain a second internal common-mode voltage in the AC-coupled mode.

25. The method of claim 23, wherein the performing DC level shifting comprises
generating an offset current to obtain a DC voltage difference between the input signal and the output signal, and
drawing the offset current to a lower power supply to prevent the offset current from passing to the output signal.

26. The method of claim 23, wherein the amplifying the input signal comprises
amplifying the input signal using an upper power supply and a first lower power supply in the DC-coupled mode, and
amplifying the input signal using the upper power supply and a second lower power supply in the AC-coupled mode.

27. The method of claim 23, wherein the amplifying the input signal comprises
    driving the output signal with a first output drive section in both the DC-coupled and AC-coupled modes, and
    driving the output signal further with a second output drive section in the AC-coupled mode.

28. An apparatus comprising:
    means for amplifying an input signal to obtain an output signal suitable for DC coupling to a load in a DC-coupled mode and for AC coupling to the load in an AC-coupled mode; and
    means for performing DC level shifting as needed to obtain a first output common-mode voltage equal to a ground voltage for coupling to the output signal in the DC-coupled mode and to obtain a second output common-mode voltage equal to a common-mode voltage for coupling to the output signal in the AC-coupled mode.

29. The apparatus of claim 28, further comprising:
    means for performing DC level shifting as needed to obtain a first internal common-mode voltage in the DC-coupled mode and to obtain a second internal common-mode voltage in the AC-coupled mode.

30. The apparatus of claim 28, wherein the means for performing DC level shifting comprises
    means for generating an offset current to obtain a DC voltage difference between the input signal and the output signal, and
    means for drawing the offset current to a lower power supply to prevent the offset current from passing to the output signal.

31. The apparatus of claim 28, wherein the means for amplifying the input signal comprises
    means for amplifying the input signal using an upper power supply and a first lower power supply in the DC-coupled mode, and
    means for amplifying the input signal using the upper power supply and a second lower power supply in the AC-coupled mode.

32. The apparatus of claim 28, wherein the means for amplifying the input signal comprises
    means for driving the output signal in both the DC-coupled and AC-coupled modes, and
    means for further driving the output signal in the AC-coupled mode.

* * * * *